United States Patent
Fratti et al.

(10) Patent No.: US 7,269,197 B2
(45) Date of Patent: Sep. 11, 2007

(54) CONTROLLING OVERSPRAY COATING IN SEMICONDUCTOR DEVICES

(75) Inventors: Roger A. Fratti, Mohnton, PA (US); Joseph Michael Freund, Fogelsville, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/232,074

(22) Filed: Sep. 21, 2005

(65) Prior Publication Data

US 2007/0065982 A1 Mar. 22, 2007

(51) Int. Cl.
*H01S 5/00* (2006.01)

(52) U.S. Cl. ................ 372/50.12; 372/49.01
(58) Field of Classification Search ............ 372/50.12, 372/49.01
See application file for complete search history.

(56) References Cited

U.S. PATENT DOCUMENTS

| | | | | |
|---|---|---|---|---|
| 4,910,166 A | | 3/1990 | Dholakia | 437/129 |
| 5,099,214 A | * | 3/1992 | Rosen et al. | 333/157 |
| 5,270,532 A | | 12/1993 | Hietala et al. | 250/214.1 |
| 5,835,515 A | | 11/1998 | Huang | 372/36 |
| 5,989,637 A | * | 11/1999 | Rizzo et al. | 427/282 |
| 6,278,820 B1 | | 8/2001 | Hayes | 385/39 |
| 2002/0151096 A1 | | 10/2002 | Baron et al. | 438/38 |
| 2004/0086009 A1 | | 5/2004 | Li | 372/36 |
| 2004/0165628 A1 | * | 8/2004 | Rice | 372/36 |

* cited by examiner

Primary Examiner—Dung T. Nguyen

(57) ABSTRACT

A manufacturing method, in which two device bars are bonded prior to facet coating to form a stacked bar pair. In one embodiment, each of the device bars has a p-side and an n-side, each side having a plurality of bonding pads, with at least some bonding pads located at the p-side of the first device bar adapted for mating with the corresponding bonding pads located at the p-side of the second device bar. Solder material deposited onto the p-side bonding pads adapted for mating is liquefied in a reflow oven, wherein surface tension of the liquefied solder self-aligns the device bars with respect to each other and keeps them in alignment until the solder is solidified to form a solder bond between the mated bonding pads. Two or more instances of the bonded bar pair are further stacked such that bonding pads located at the n-sides of adjacent bar pairs are mated in a relatively tight fit. The exposed facets in the resulting stack are then spray-coated with one or more reflective materials, with the solder bonds between the p-side bonding pads and the tight fit between the n-side bonding pads protecting those pads from overspray coating.

6 Claims, 4 Drawing Sheets

CONTROLLING OVERSPRAY COATING IN SEMICONDUCTOR DEVICES

BACKGROUND OF THE INVENTION

1. Field of the Invention

The present invention relates to optical communication and data storage equipment and, more specifically, to manufacturing of semiconductor devices, e.g., semiconductor lasers and traveling-wave photodetectors, that have coated facets.

2. Description of the Related Art

Semiconductor lasers are used in a variety of applications, e.g., optical communication systems, optical storage devices, printers, and copiers. In a typical manufacturing process, semiconductor lasers are fabricated using a wafer having an appropriate layered structure for the active (i.e., light-generating) region of the laser. The wafer is cut into bars, each of which is essentially a one-dimensional laser array. The manufacturing process then involves application of thin films of glasslike materials to the terminal sides, called facets, of the laser bar to define laser cavities. These thin films are usually referred to as facet coatings. Due to the nature of the facet coating process, the coating material can overspray and cover unmasked areas of the laser bar in addition to the facets. In particular, overspray coating of the top and bottom surfaces of the laser bar is undesirable because those surfaces have bonding (e.g., gold) pads for mechanical and/or electrical connections.

For certain applications, optical power/wavelength requirements are such that an individual semiconductor laser cannot provide adequate optical power and/or selection of wavelengths. To provide a suitable light source for some of those applications, laser bars are not cleaved into individual lasers, but rather, two or more laser bars are stacked to form a two-dimensional laser array. One example of such an array is disclosed in U.S. Pat. No. 5,835,515, the teachings of which are incorporated herein by reference. A typical prior-art process of stacking the laser bars involves (i) hardware fixtures for aligning the bars and (ii) special gasket inserts for masking off the bonding pads from overspray coating. As provided in U.S. Pat. No. 5,989,637, the teachings of which are incorporated herein by reference, a gasket insert is a relatively sophisticated piece of hardware that can add significantly to the complexity of the manufacturing process. Disadvantageously, aligning the laser bars, manufacturing gasket inserts, placing the inserts between the stacked bars, and then removing the inserts from the slots between the bars to provide access to the bonding pads after the facet coating process is completed can significantly complicate the process of manufacturing two-dimensional laser arrays.

SUMMARY OF THE INVENTION

Problems in the prior art are addressed, in accordance with the principles of the present invention, by a manufacturing method, in which two laser bars are bonded prior to facet coating to form a stacked bar pair. In one embodiment, each of the laser bars has a p-side and an n-side, each side having a plurality of bonding pads, with at least some bonding pads located at the p-side of the first laser bar adapted for mating with the corresponding bonding pads located at the p-side of the second laser bar. Solder material deposited onto the p-side bonding pads is liquefied in a reflow oven, wherein surface tension of the liquefied solder self-aligns the laser bars with respect to each other and keeps them in alignment until the solder is solidified to form a solder bond between the mated bonding pads. Two or more instances of the bonded bar pair are further stacked such that bonding pads located at the n-sides of adjacent bar pairs are mated in a relatively tight fit. The exposed facets in the resulting stack are then spray-coated with one or more reflective materials, with the solder bonds between the p-side bonding pads and the tight fit between the n-side bonding pads protecting those pads from overspray coating. The processed stack can then be taken apart, e.g., to cleave the flip-chip bonded laser bars into laser pairs, or outfitted with electrical connections, e.g., to form a relatively large two-dimensional laser array. Advantageously, embodiments of the invention alleviate the prior-art problems with the alignment of laser bars and control of overspray coating. In addition, embodiments of the invention can be used in the fabrication of other semiconductor devices that have coated facets, such as traveling-wave photodetectors.

According to one embodiment, the present invention is a manufacturing method comprising: (A) forming first and second device bars, each having an array of semiconductor devices; (B) bonding the first device bar to the second device bar to form a bonded bar pair; and (C) coating one or more facets of the bonded bar pair with one or more coating materials.

According to another embodiment, the present invention is an apparatus, comprising a stacked bar pair, wherein: the bar pair comprises first and second device bars, each bar having an array of semiconductor devices; each of the first and second device bars comprises one or more facets coated with one or more coating materials; the first device bar is bonded to the second device bar; and each of the first and second device bars has a first side and a second side, wherein: for each bar, the first side comprises a first plurality of pads corresponding to the semiconductor devices; and the first bar is aligned with respect to the second bar such that at least some of the pads from the first plurality of the first bar are mated to at least some of the pads from the first plurality of the second bar, wherein the mated pads are bonded by a solidified solder bond; for each bar, the second side comprises a second plurality of pads corresponding to the semiconductor devices; and at least one of the second sides of the first and second bars comprises a pattern formed by a coating material used for the facet coating, wherein said pattern substantially conforms to a profile of the second plurality of pads.

According to yet another embodiment, the present invention is an apparatus comprising first and second semiconductor devices, wherein: each of the first and second devices comprises one or more facets coated with one or more coating materials; and the first device is bonded to the second device, wherein each of the first and second devices has a first side and a second side, wherein: for each device, the first side comprises one or more pads; the first device is aligned with respect to the second device such that at least one pad of the first side of the first device is mated to at least one pad of the first side of the second device, wherein the mated pads are bonded by a solidified solder bond; and at least one of the second sides of the first and second devices comprises a pattern formed by a coating material used for the facet coating, wherein said pattern substantially conforms to a profile of one or more pads located at said side.

BRIEF DESCRIPTION OF THE DRAWINGS

Other aspects, features, and benefits of the present invention will become more fully apparent from the following detailed description, the appended claims, and the accompanying drawings in which:

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figure 1A:
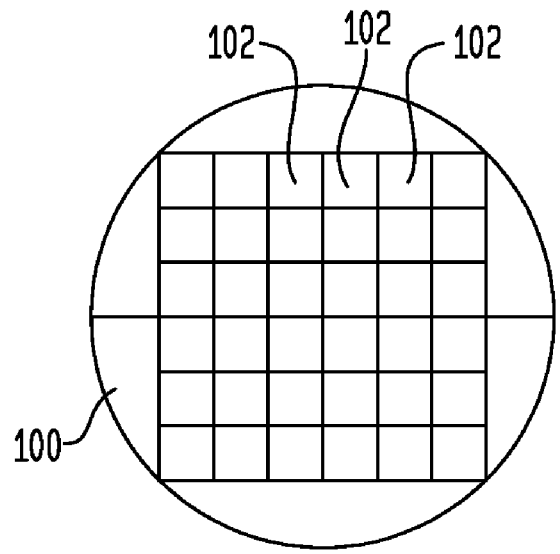
FIGS. 1A-D illustrate a representative prior-art manufacturing process that can be used for fabricating semiconductor lasers.
Figure 1B:
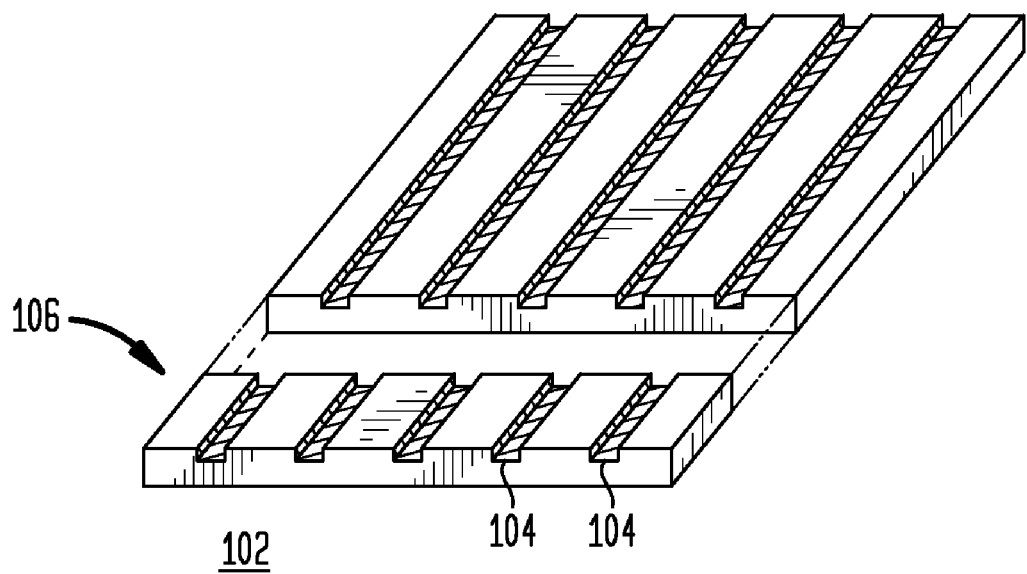

FIGS. 1A-D illustrate a representative prior-art manufacturing process that can be used for fabricating semiconductor lasers. Referring to FIG. 1A, layered structures used in semiconductor lasers are typically formed on a substrate wafer 100 using a stripe-geometry technique that ultimately yields edge emitting lasers. These layered structures are arranged on wafer 100 as rectangular blocks 102, into which the wafer is separated after the layered structures have been formed. FIG. 1B shows in more detail individual block 102 cleaved from wafer 100. Block 102 has a plurality of laser-diode stripes 104. In a representative embodiment, each stripe 104 has a width of about a few micrometers and a thickness of about one micrometer, and the separation between adjacent stripes 104 is about a few hundred micrometers. Block 102 is further cleaved into a plurality of laser bars 106 as indicated in FIG. 1B.

Figure 1C:
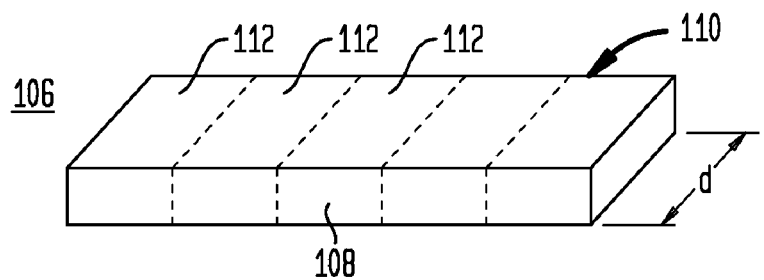

FIG. 1C shows individual laser bar 106 separated from block 102. A front-edge facet 108 and a rear-edge facet 110 of laser bar 106 are coated with reflective materials having relatively low and high reflection coefficients, respectively. Coated facets 108 and 110 together with the corresponding laser-diode stripe 104 (not shown in FIG. 1C) define a laser cavity for each laser 112 of laser bar 106. The length, d, of the laser cavity, among other things, determines the wavelength of the light generated by each individual laser 112. Typical cavity lengths can range from about 100 micrometers to about 1000 micrometers.

Figure 1D:
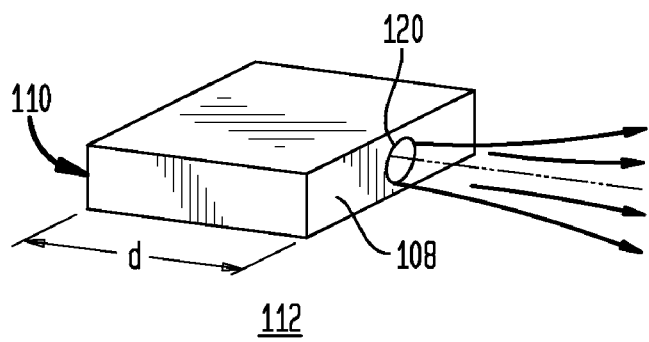

FIG. 1D illustrates light emission from laser 112, which can optionally be separated from laser bar 106. When appropriate voltages are applied to laser 112, light generated within the laser cavity exits through facet 108 to form a diverging light beam 120.

Figure 2:
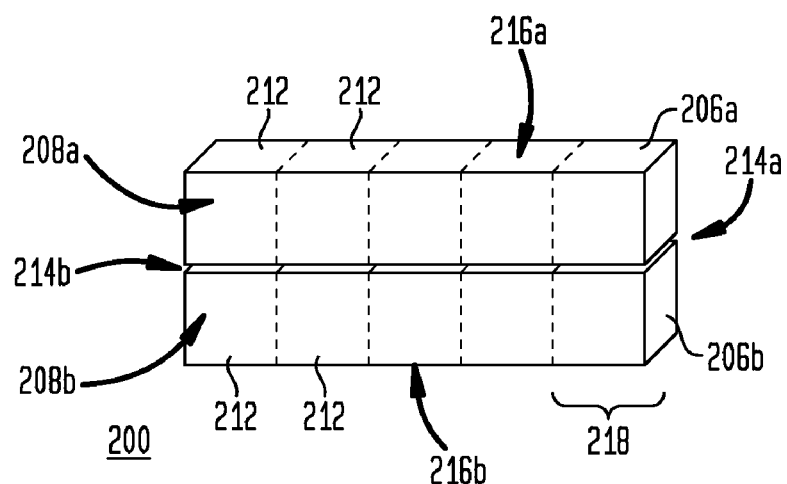
FIG. 2 shows a two-dimensional laser array according to one embodiment of the invention.

FIG. 2 shows a two-dimensional laser array 200 according to one embodiment of the invention. More specifically, array 200 has two laser bars 206a-b bonded together, where each laser bar 206 is substantially analogous to laser bar 106 of FIG. 1C. For illustration purposes, each laser bar 206 is shown as having five lasers 212, although, in other embodiments, each laser bar can have fewer or more than five lasers. Laser bars 206a-b are attached to one another such that (1) their p-sides 214a-b (typically the sides having laser-diode stripes analogous to laser-diode stripes 104 shown in FIG. 1B) are facing one another, (2) their n-sides 216a-b (typically the sides corresponding to the substrate layer of the wafer) are pointing outwards and are parts of the outer surface of laser array 200, and (3) light-emitting facets 208a-b are pointing in the same direction. This type of attachment is often referred to as flip-chip bonding because laser bar 206a is flipped upside down prior to the attachment to laser bar 206b. Laser bars 206a-b are aligned with respect to one another such that each individual laser 212 of laser bar 206a is aligned with the corresponding laser 212 of laser bar 206b. Each laser 212 has one or more bonding pads (not shown in FIG. 2) on each of sides 214 and 216. These bonding pads are used, e.g., as electrodes adapted to supply appropriate operating voltages to the laser. In addition or alternatively, some or all of the bonding pads located at side 214 are used for the attachment of laser bars 206a-b to one another.

In one embodiment, two or more laser arrays 200 are further stacked, e.g., as described in the above-cited '515 patent, to form a relatively large two-dimensional laser array suitable for applications that require relatively high optical power (e.g., over about 1 W). In another embodiment, laser array 200 is cut into sections to form flip-chip-bonded pairs of lasers 212, such as laser pair 218. Separated laser pair 218 can then be used as a light source, e.g., in a DVD-R optical read/write head, where the first and second lasers 212 in the laser pair are configured to emit at 650 and 630 nm, respectively, to enable the corresponding read and write functions of the head.

Figure 3A:
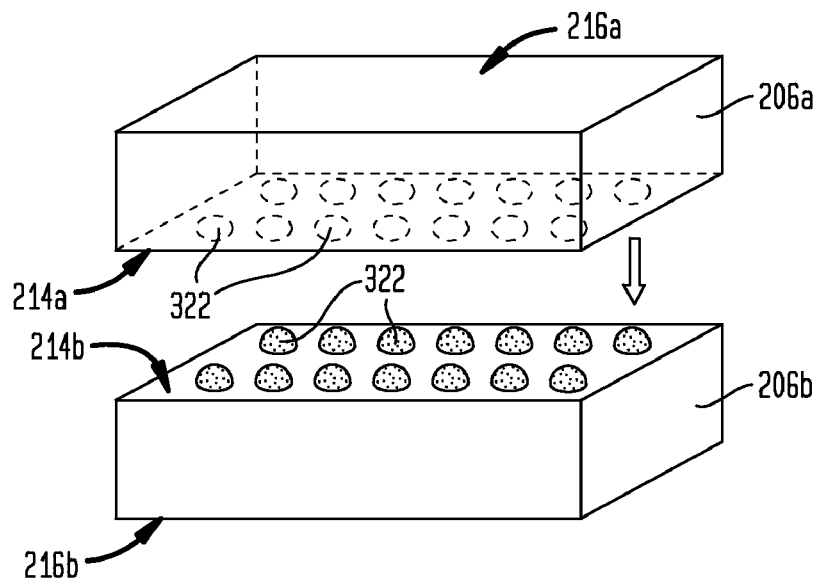
FIGS. 3A-C illustrate a method of fabricating the laser array shown in FIG. 2 according to one embodiment of the invention.
Figure 3B:
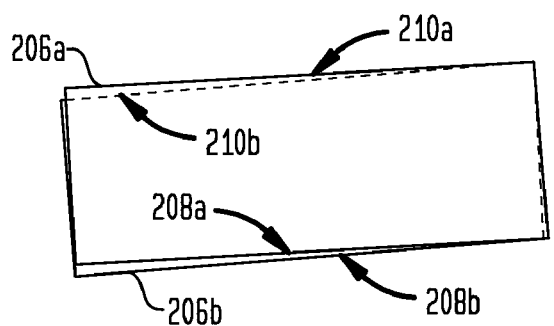
Figure 3C:
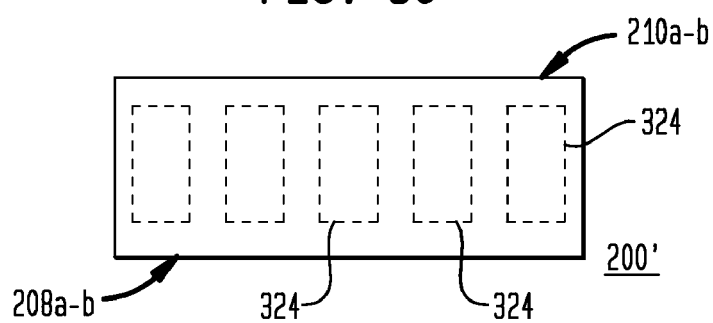

FIGS. 3A-C illustrate a method of fabricating laser array 200 according to one embodiment of the invention. Referring to FIG. 3A, each of laser bars 206a-b (obtained, e.g., as indicated in FIG. 1B) is provided with solder bumps 322, which are deposited in a conventional manner onto the bonding pads located at sides 214a-b of the laser bars. Laser bar 206a is then flipped over and placed on top of laser bar 206b as indicated by the block arrow in FIG. 3A, with FIG. 3B showing a top view of the resulting laser-bar stack. Normally, without the use of special bar-aligning fixtures, stacked laser bars 206a-b are misaligned with respect to one another. FIG. 3B shows a typical case of misalignment, where laser bar 206a is slightly rotated with respect to laser bar 206b such that facet 208a is set back with respect to facet 208b while facet 210a overhangs facet 210b.

FIG. 3C shows a top view of the laser-bar stack of FIG. 3B after that laser-bar stack has been treated in a reflow oven. More specifically, the laser-bar stack of FIG. 3B is placed in a reflow oven (preferably having a reducing atmosphere), where the stack heats up causing solder bumps 322 to (i) liquefy, (ii) spread over bonding pads 324 located at sides 214a-b, and (iii) for each pair of bonding pads 324 facing each other, coalesce into a fluid layer sandwiched between those pads. Because bonding pads 324 have a relatively high combined surface area while laser bar 206a is relatively thin (e.g., about 100 microns) and, as a result, has a relatively small mass, surface tension of the liquefied solder is capable of generating sufficient force to cause sliding of laser bar 206a over laser bar 206b. The surface tension tends to minimize free surface area of the fluid and, as such, causes laser bar 206a to move relative to laser bar 206b such that the laser bars adopt a relative orientation characterized by substantially the lowest possible free surface area of the liquefied solder sandwiched between opposing bonding pads 324. Because laser bars 206a-b have substantially identical layouts of bonding pads 324, the bonding pads become aligned with respect to one another, which causes the laser bars to also become aligned with respect to one another. As the temperature of the stack is lowered, the surface tension of the liquefied solder keeps laser bars 206a-b in alignment until the solder solidifies and fixes the aligned position to produce a laser-bar stack 200' shown in FIG. 3C. Note that one distinction of laser-bar stack 200' of FIG. 3C from laser array 200 of FIG. 2 is that the facets of laser bars 206a-b in laser-bar stack 200' are not yet coated with reflective materials.

During subsequent processing steps, facets 208a-b and 210a-b of laser-bar stack 200' are spray-coated with respective reflective materials. Due to the presence of an opening between laser bars 206a-b, the coating materials might penetrate into that opening. However, the solder bond present between bonding pads 324 advantageously protects the corresponding electrical contacts from overspray coating. At the completion of the spray-coating process and other necessary processing steps, laser-bar stack 200' is transformed into laser array 200.

Figure 4A:
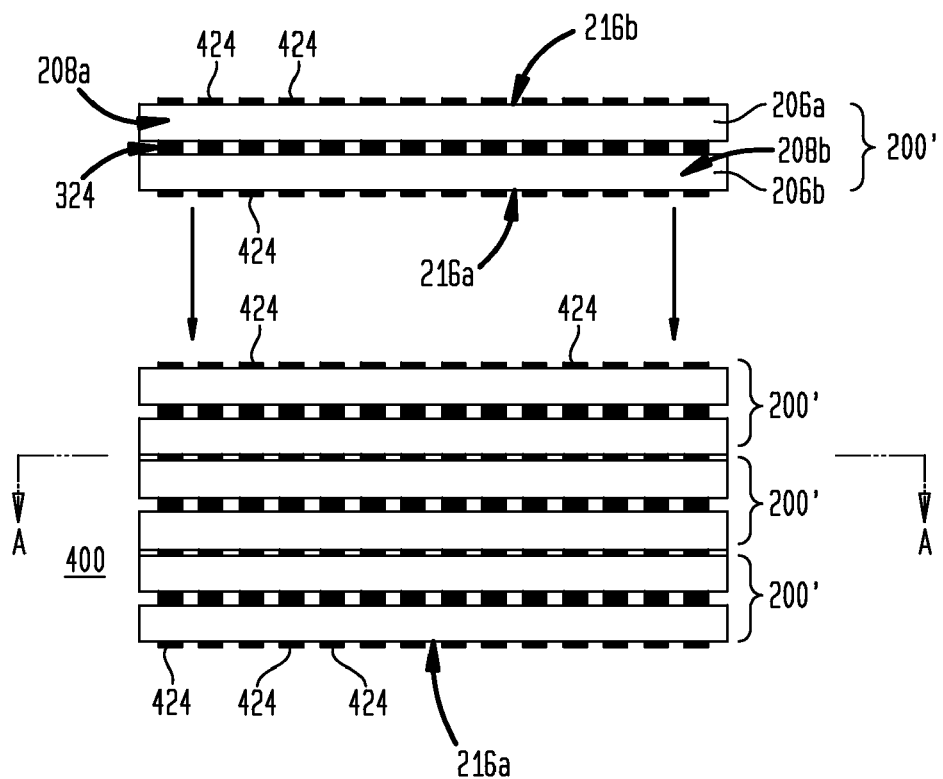
FIGS. 4A-B illustrate facet coating that can be used in the method of FIG. 3 according to one embodiment of the invention.
Figure 4B:
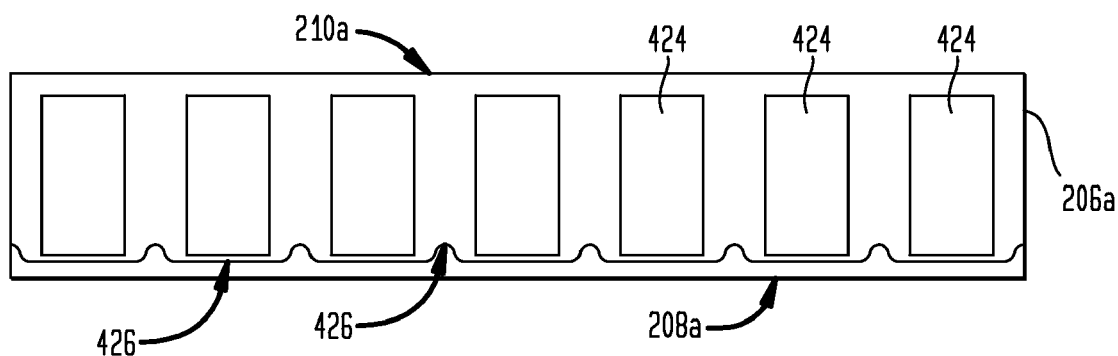

FIGS. 4A-B illustrate facet coating that can be used in the method of FIG. 3 according to one embodiment of the invention. More specifically, two or more laser-bar stacks 200' (FIG. 3C) are further stacked to form a laser-bar stack 400 shown in FIG. 4A. In laser-bar stack 400, laser-bar stacks 200' are aligned such that bonding pads 424 located at sides 216 of laser bars 206 facing one another are in alignment with each other. This alignment of laser-bar stacks 200' can be performed, e.g., using an alignment fixture similar to that disclosed in the above-cited '637 patent. Facets 208 and 210 of all laser bars 206 in laser-bar stack 400 are then spray-coated with the respective reflective materials.

During the coating process, bonding pads 324 located at sides 214 of laser bars 206 are protected from overspray coating in laser-bar stack 400 due to the presence of solder bonds. For the following reasons, bonding pads 424 located at sides 216 of laser bars 206 in laser-bar stack 400 are also protected from overspray coating. The opening between sides 216 of adjacent laser-bar stacks 200' is relatively narrow, e.g., compared to that between sides 214 in laser-bar stack 200' because each side 216 is substantially flat, while each side 214 might have a rather complicated topology (see also FIG. 1B). As a result, the amount of coating material that penetrates into each opening between sides 216 is relatively small. Because bonding pads 424 facing each other in laser-bar stack 400 are in alignment with one another, these bonding pads can effectively protect each other from overspray coating even without a solder bond between them. The topmost and bottommost sides 216 in laser-bar stack 400 can be protected from overspray coating, e.g., using special masks that are similar to the gasket inserts disclosed in the above-cited '637 patent.

FIG. 4B shows a top cross-sectional view of laser-bar stack 400 after facets 208 in the stack have been spray-coated with a reflective material. More specifically, the cross-section shown in FIG. 4B (also labeled AA in FIG. 4A) is drawn through an opening between two adjacent laser-bar stacks 200' in stack 400. As already indicated above, the coating material can seep into that opening to form a ridge (or a pattern) 426. As used in this specification, the terms "ridge" and/or "pattern" do not imply a particular shape or topology. It should be appreciated by one skilled in the art that these terms describe a shape of the solidified coating material that penetrated into the opening between two adjacent laser-bar stacks during spray coating. This shape can be irregular or have at least some degree of regularity influenced by the topology of the opening and the layout of the corresponding bonding pads. For example, in one embodiment, ridge or pattern 426 can have some degree of spatial periodicity to it, which is imposed by the existing periodicity of the bonding pads. On the other hand, if the bonding pads are arranged in a non-periodic manner and/or have different non-repeating shapes, then the shape of ridge or pattern 426 can be non-periodic and/or irregular. In some embodiments, ridge or pattern 426 might have breaks or discontinuities. In a representative embodiment, the shape of ridge or pattern 426 generally follows the contours of the bonding pads and is influenced by the manner and conditions in which the coating process has been performed and the amount, type, and fluidity of the coating material used in that process.

In one embodiment, ridge or pattern 426 has an irregular, free-flow shape that has a greater penetration depth into the opening in the areas located between bonding pads 424 compared to that in the areas located directly in front of those bonding pads. The free-flow shape generally conforms to the lateral profile of bonding pads 424, with the extent of penetration into the opening depending on various factors, e.g., the height of the opening, the viscosity of the coating material, solidification time, etc. This conforming shape is markedly different from a well-defined (substantially linear) ridge shape that would have been produced if bonding pads 424 were protected from overspray coating by prior-art gasket inserts (disclosed in the above-cited '637 patent). A ridge or pattern (not shown in FIG. 4B) that is analogous to ridge or pattern 426 is also formed at the opposite side of the opening when facets 210 of laser-bar stack 400 are similarly spray-coated with the corresponding reflective material.

After the facet coating in laser-bar stack 400 is completed, that laser-bar stack can be taken apart to yield a plurality of laser arrays 200 (FIG. 2). As already indicated above, individual laser arrays 200 can then be used to produce laser pairs 218 or restacked to form a relatively large two-dimensional laser array, e.g., analogous to that described in the '515 patent. Alternatively, after the facet coating in laser-bar stack 400 is completed, laser arrays 200 in the stack can be outfitted with electrical leads/connections to produce a corresponding relatively large two-dimensional laser array.

While this invention has been described with reference to illustrative embodiments, this description is not intended to be construed in a limiting sense. Although this invention has been described in reference to semiconductor lasers, one skilled in the art will appreciate that the invention can similarly be used for manufacturing other semiconductor devices having coated facets. One example of such a semiconductor device might be a traveling-wave photodetector similar to that disclosed in one of U.S. Pat. Nos. 5,270,532 and 6,278,820, the teachings of both of which are incorporated herein by reference. In addition, embodiments of the invention can be practiced with different types of light-emitting devices, e.g., surface-emitting devices, such as a vertical cavity surface-emitting laser (VCSEL) and/or a light-emitting diode (LED). Different device bars within a bar stack can include similar or dissimilar devices. For example, a device pair analogous to laser pair 218 of FIG. 2 can have either: (1) two light-emitting devices, (2) a light-emitting device and a detector (e.g., a traveling-wave photodetector), (3) two light detectors, etc. As used in this specification, the term "light" refers to any suitable electromagnetic radiation in any wavelength and is not necessarily limited to visible light. Although embodiments of the invention have been described in reference to laser bars 206a-b having substantially identical bonding-pad layouts (see, e.g., FIGS. 2 and 4A), the invention is not so limited. In one embodiment, the bars analogous to laser bars 206a-b can have different bonding-pad layouts as long as those layouts enable proper mating of: (i) the bars in a flip-chip bonded bar pair analogous to laser-bar stack 200' and/or (ii) adjacent bar pairs in a stack analogous to stack 400 (FIG. 4). In one embodiment, mated bonding pads 424 in stack 400 can be solder-bonded in a manner substantially similar to that described in reference to bonding pads 324 of stack 200' (FIG. 3). Bonding arrangements other than a flip-chip bonding arrangement can similarly be used to form a bonded bar pair. Three or more device bars can be soldered together before facet coating. Other bonding techniques, different from solder the solder bonding technique described herein, can also be used in various embodiments of the invention. Various modifications of the described embodiments, as well as other embodiments of the invention, which are apparent to persons skilled in the art to which the invention pertains are deemed to lie within the principle and scope of the invention as expressed in the following claims.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

What is claimed is:

1. Apparatus, comprising a stacked bar pair, wherein:
   the bar pair comprises first and second device bars, each bar having an array of semiconductor devices;
   each of the first and second device bars comprises one or more facets coated with one or more coating materials;
   the first device bar is bonded to the second device bar; and
   each of the first and second device bars has a first side and a second side, wherein:
     for each bar, the first side comprises a first plurality of pads corresponding to the semiconductor devices; and
     the first bar is aligned with respect to the second bar such that at least some of the pads from the first plurality of the first bar are mated to at least some of the pads from the first plurality of the second bar, wherein the mated pads are bonded by a solidified solder bond;
     for each bar, the second side comprises a second plurality of pads corresponding to the semiconductor devices; and
     at least one of the second sides of the first and second bars comprises a pattern formed by a coating material used for the facet coating, wherein said pattern substantially conforms to a profile of the second plurality of pads.

2. The invention of claim 1, wherein each semiconductor device comprises an edge-emitting device.

3. The invention of claim 1, wherein the apparatus comprises two or more instances of the bar pair, wherein said two or more instances are stacked to form a two-dimensional array of semiconductor devices.

4. Apparatus, comprising first and second semiconductor devices, wherein:
   each of the first and second devices comprises one or more facets coated with one or more coating materials; and
   the first device is bonded to the second device, wherein each of the first and second devices has a first side and a second side, wherein:
     for each device, the first side comprises one or more pads;
     the first device is aligned with respect to the second device such that at least one pad of the first side of the first device is mated to at least one pad of the first side of the second device, wherein the mated pads are bonded by a solidified solder bond; and
     at least one of the second sides of the first and second devices comprises a pattern formed by a coating material used for the facet coating, wherein said pattern substantially conforms to a profile of one or more pads located at said side.

5. The invention of claim 4, wherein:
   each semiconductor device comprises an edge-emitting device; and
   the edge-emitting device of the first device is adapted to emit light of different wavelength than wavelength of light emitted by the edge-emitting device of the second device.

6. The invention of claim 4, wherein:
   the first semiconductor device comprises an edge-emitting device; and
   the second semiconductor device comprises a detector.

* * * * *